(12) United States Patent
Yang et al.

(10) Patent No.: US 11,290,798 B2
(45) Date of Patent: Mar. 29, 2022

(54) MICROPHONE ASSEMBLY

(71) Applicant: AAC Technologies Pte. Ltd., Singapore (SG)

(72) Inventors: Guixia Yang, Shenzhen (CN); Changjin Ma, Shenzhen (CN); Jianwei Chen, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 56 days.

(21) Appl. No.: 16/524,195

(22) Filed: Jul. 29, 2019

(65) Prior Publication Data

US 2020/0045400 A1    Feb. 6, 2020

(30) Foreign Application Priority Data

Aug. 2, 2018  (CN) .......................... 201821242883.7

(51) Int. Cl.
| | | |
|---|---|---|
| *H04R 25/00* | (2006.01) | |
| *H04R 1/08* | (2006.01) | |
| *H05K 1/02* | (2006.01) | |
| *H05K 1/18* | (2006.01) | |
| *H05K 1/14* | (2006.01) | |
| *H01R 12/78* | (2011.01) | |

(52) U.S. Cl.
CPC ............. *H04R 1/08* (2013.01); *H05K 1/0277* (2013.01); *H05K 1/14* (2013.01); *H05K 1/181* (2013.01); *H01R 12/78* (2013.01); *H05K 2201/044* (2013.01); *H05K 2201/10083* (2013.01)

(58) Field of Classification Search
CPC ........ H04R 1/08; H04R 12/78; H05K 1/0277; H05K 1/14; H05K 1/181; H05K 2201/044; H05K 2201/10083; H05K 1/0216; H05K 9/00; G06F 1/1626; G06F 1/1656; G06F 1/1658; H04M 1/0277
USPC ......................................................... 381/369
See application file for complete search history.

(56) References Cited

U.S. PATENT DOCUMENTS

| | | | | |
|---|---|---|---|---|
| 9,143,879 B2 * | 9/2015 | McElveen | ............... | H04S 3/002 |
| 2017/0142823 A1 * | 5/2017 | Shim | ..................... | G06F 1/1626 |
| 2019/0384358 A1 * | 12/2019 | Choe | ..................... | G06F 1/1698 |

* cited by examiner

*Primary Examiner* — Phylesha Dabney
(74) *Attorney, Agent, or Firm* — W&G Law Group

(57) ABSTRACT

A microphone assembly includes a circuit board and a microphone array disposed on the circuit board. The circuit board includes: a first FPC extending along a first direction, and a second FPC extending along a second direction different from the first direction and separated from the first FPC, the second FPC and the first FPC are fixed to each other and form an electrical connection, and the microphone array is disposed on the first FPC.

5 Claims, 5 Drawing Sheets

MICROPHONE ASSEMBLY

TECHNICAL FIELD

The present disclosure relates to the field of electronic technologies, and in particular, to a microphone assembly.

BACKGROUND

With the rapid development of science and technology, mobile phones, notebooks, cameras and other electronic devices have become essential tools in people's work and life. The quality of their products is related to the quality and coordination of their internal parts. A Flexible Printed Circuit Board (FPC) is a common accessory in the electronic devices. The FPC, also referred to as "soft board," is a circuit board made of a flexible insulating base material. Compared with the rigid printed circuit board, it has many advantages, for example, high reliability, and good flexibility. In addition, it is also featured with high wiring density, light weight, and thin thickness, and thus is widely used in connections of electronic devices. In general, the FPC is divided into one-sided, two-sided and multi-layered circuit boards, and mainly uses polyimide or polyester film as the base material. The material has good heat resistance and good dimensional stability, and is laminated together with a cover film featured with mechanical protection and electrical insulation to form a final product. The FPC is generally used to connect different circuits in different regions.

However, the inventor of the present disclosure finds that to implement electrical connections between different regions, the FPC is usually made into a strip shape with various corners, which has a complex overall structure and an irregular shape, and in the process of assembling the entire PFC, manual arrangement and coordination are often required, thereby affecting assembling operability, reducing assembling efficiency, and not convenient for the implementation of circuit assembling.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding portions throughout the several views.

DESCRIPTION OF EMBODIMENTS

The present invention will be further illustrated with reference to the accompanying drawings and the embodiments.

Figure 1:
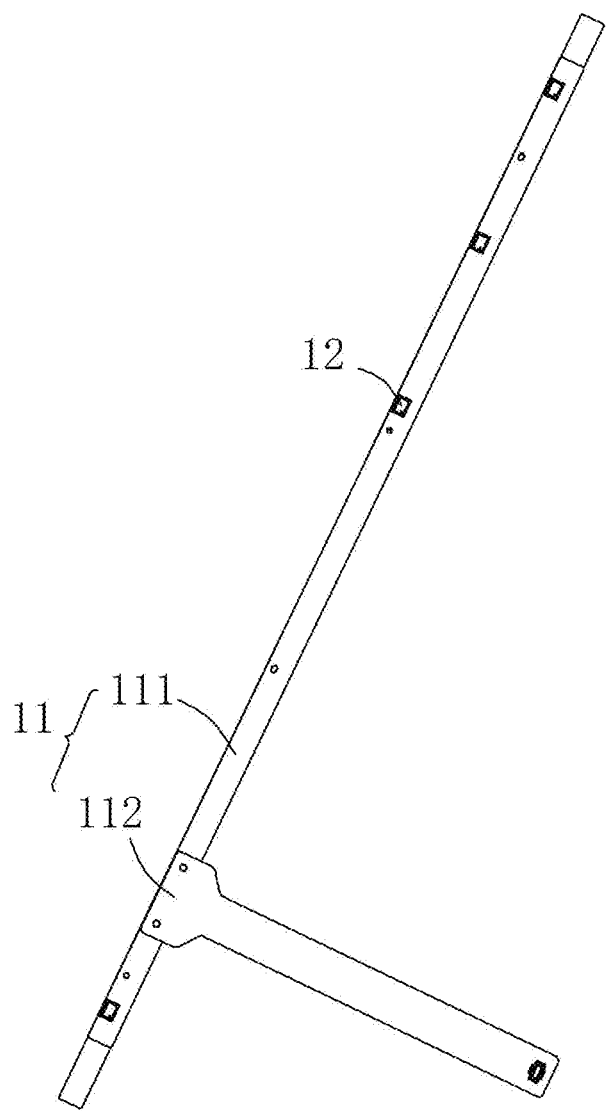
FIG. 1 is a schematic diagram of an overall structure of a microphone assembly according to an embodiment of the present disclosure.
Figure 2:
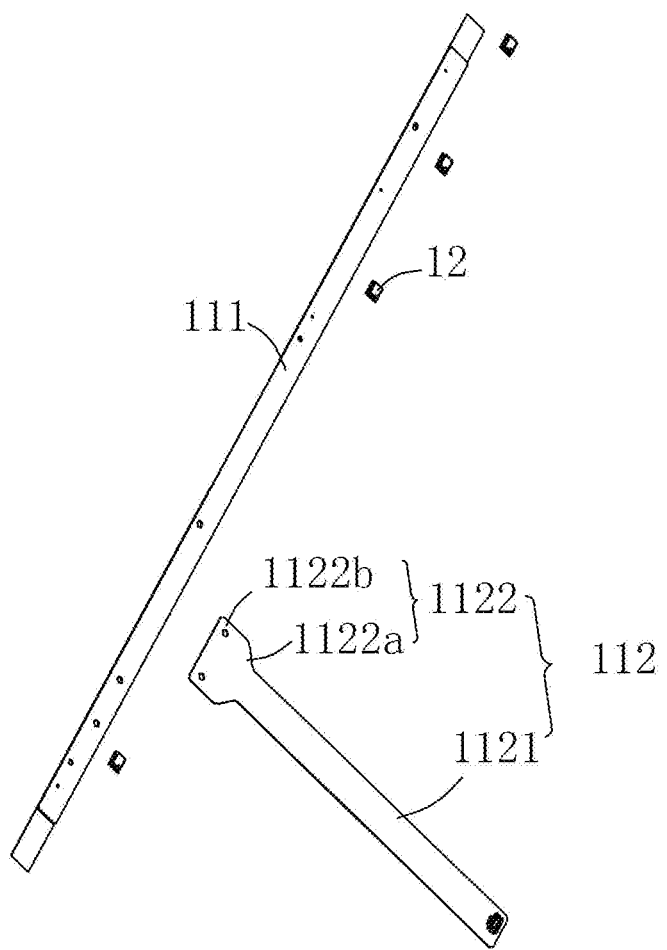
FIG. 2 is a schematic diagram of a split structure of a microphone assembly according to an embodiment of the present disclosure.

A first embodiment of the present disclosure relates to a microphone assembly 100. As shown in FIG. 1 and FIG. 2, the microphone assembly 100 includes a circuit board 11 and a microphone array 12 disposed on the circuit board 11. The circuit board 11 includes: a first FPC 111 extending along a first direction, and a second FPC 112 extending along a second direction different from the first direction and separated from the first FPC 111, the second FPC 112 and the first FPC 111 are fixed to each other and form an electrical connection, and the microphone array 12 is disposed on the first FPC 111.

In this embodiment, the circuit board 11 provided with the microphone array 12 includes the first FPC 111 and the second FPC 112 that are separated from each other, and the first FPC 111 and the second FPC 112 can be fixed and electrically connected to each other. When the circuit board 11 having the microphone array 12 is circuit-assembled, the first FPC 111 and the second FPC 112 can be assembled separately. In other words, a large and complex circuit board 11 is divided into two small FPCs 111 and 112 for assembly. In this way, manual arrangement and coordination on the large-size circuit board 11 in the assembling process are reduced, assembling operability and assembling efficiency are improved, the implementation of circuit assembling is facilitated, and the assembling of the entire microphone assembly 100 is also facilitated.

Implementation details of this embodiment are described in detail below. The following contents are provided only for the convenience of understanding the implementation details and are not necessary for the implementation of this solution.

In this embodiment, the microphone assembly 100 includes a circuit board 11 and a microphone array 12.

The circuit board 11 is used to provide conductive lines and to implement electrical connections between different regions and different devices. In this embodiment, the circuit board 11 can help the microphone array 12 be powered on, thus implementing a microphone function. The circuit board 11 includes a first FPC 111 and a second FPC 112.

The first FPC 111 extends along a first direction. In this embodiment, the first FPC 111 is strip-like. As shown in FIG. 1, it has two ends. In other embodiments, the first FPC 111 may be further provided with multiple bent extending portions (not shown), each of which may be further provided with a clip for forming an electrical connection with other structures to meet the requirements of connecting multiple circuits. It should be appreciated that the above description is merely an example of implementation and does not constitute a limitation to the solution in other embodiments. For example, in other embodiments, the first FPC 111 may be in other shapes, which are not described here one by one.

The second FPC extends along a second direction, and the second direction and the first direction are not the same direction. For example, the second direction may be perpendicular to the first direction, or tilted by only an acute angle relative to the first direction, which is not limited here.

Specifically, the second FPC 112 includes a body portion 1121 and a connection portion 1122. The body portion 1121 is in the shape of a long rectangle. The connection portion 1122 is connected to the body portion 1121, and the connection portion 1122 is wider than the body portion 1121. In this embodiment, to fix the second FPC 112 and the first FPC 111 together more firmly, the second FPC 112 and the first FPC 111 are connected via a wider connection portion 1122 and form an electrical connection. In this way, the connection portion 1122 can be further prevented from fracture due to a stress, as shown in FIG. 1 and FIG. 2.

Further, in this embodiment, the connection portion 1122 includes a first region 1122a and a second region 1122b. The first region 1122a is connected to the body portion, and the width of the first region 1122a changes gradually. Specifically, the first region 1122a gradually widens along a direction facing away from the body portion 1121. The second region 1122b is connected to the widest part of the first region 1122a, and the width of the second region 1122b is constant. Specifically, the width of the second region 1122b is equal to the widest part of the first region 1122a. In this embodiment, the second FPC 112 is connected to the first FPC 111 via the second region 1122b.

In this embodiment, one end of the second FPC 112 is connected near the end of the first FPC 111, as shown in FIG. 1 and FIG. 2. Besides, the length of the second FPC 112 is shorter than that of the first FPC 111. It should be appreciated that the above structures are designed to fit the circuit structure in this embodiment, and their description is only an example of implementation and does not constitute a limitation to the solution in other embodiments. In other embodiments, both the connection position between the second FPC 112 and the first FPC 111 and the length thereof can be adjusted, which are not described here one by one.

The second FPC 112 and the first FPC 111 may be connected in many manners. For example, the second FPC 112 and the first FPC 111 can be connected via a connector. The connector can specifically be a plug and a socket (or a male socket and a female socket matched therewith) respectively disposed on the second FPC112 and the first FPC111. As the connector can quickly implement connection/disassembly of two structures, in this embodiment, the connector can be used to conveniently implement an assembling connection of the first FPC111 and the second FPC112 to implement electrical connection, and the second FPC112 and the first FPC111 connected together can also be conveniently disassembled for maintenance and replacement.

It should be appreciated that the second FPC 112 can also be connected to the first FPC 111 via a bonding pad. In this way, the second FPC 112 and the first FPC 111 can be connected more firmly.

Definitely, the connection mode of the second FPC 112 and the first FPC 111 is not merely limited to those illustrated above, and other structures and modes that can connect the second FPC 112 with the first FPC 111 are also within the protection scope of the solution, which are not described here one by one.

The microphone array 12 is disposed on the circuit board 11. In this embodiment, the microphone array 12 is disposed on the first FPC 111. Specifically, in this embodiment, the microphone array 12 includes four microphones distributed along the first direction and pairwise spaced part from each other on the first FPC 111, as shown in FIG. 1.

Figure 3:
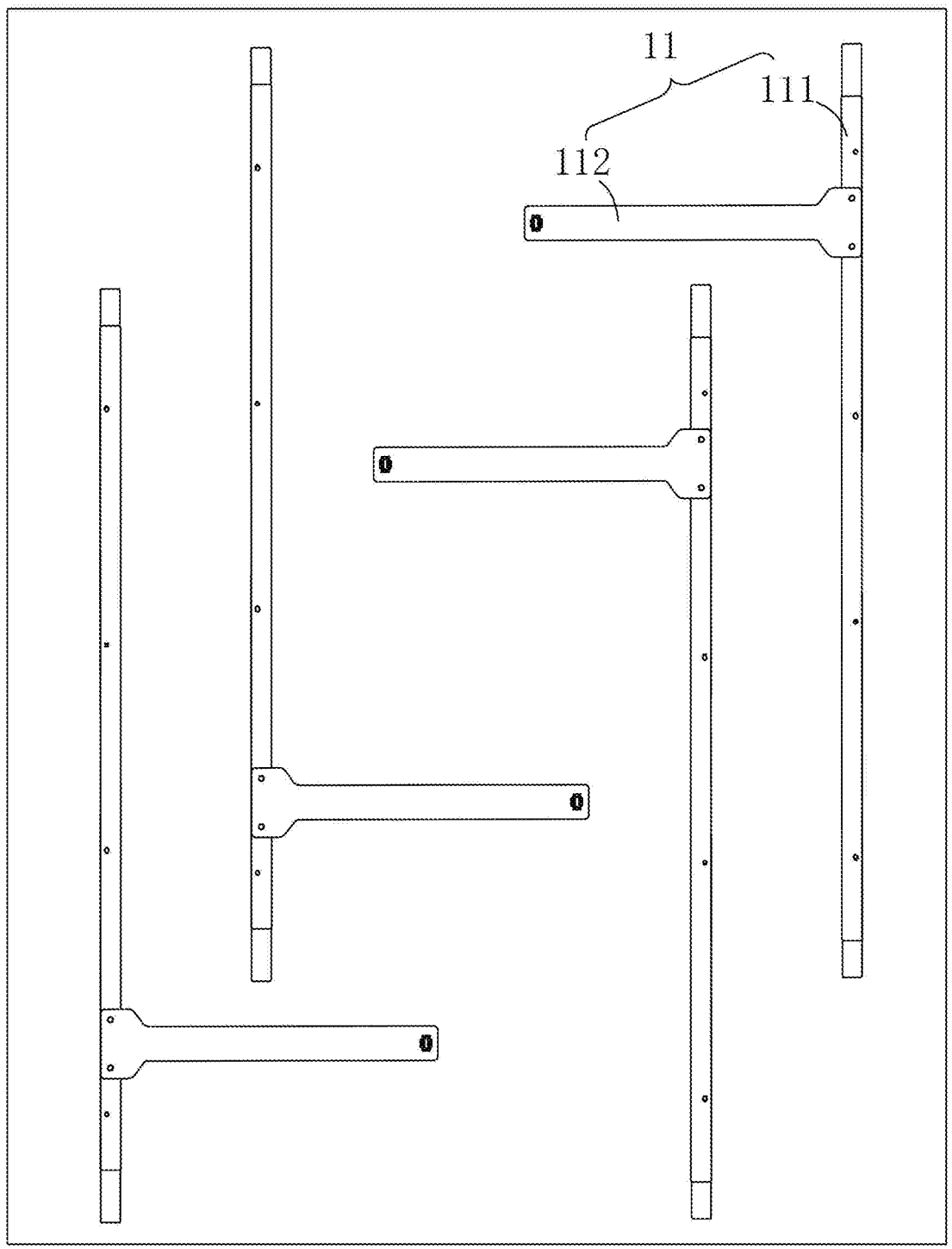
FIG. 3 is a schematic diagram of a layout structure of the FPC of the prior art.
Figure 4:
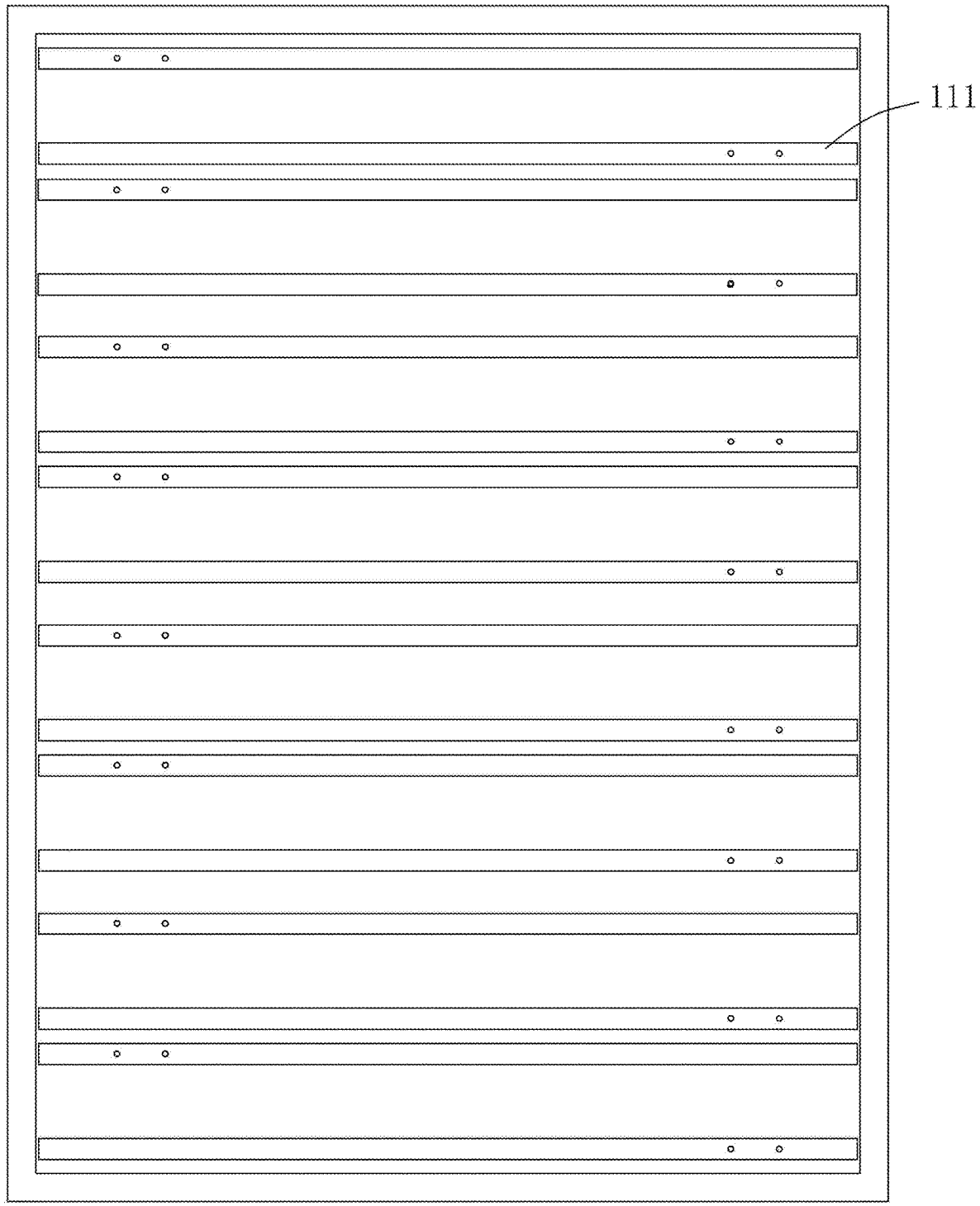
FIG. 4 is a schematic diagram of a layout structure of a first FPC in a microphone assembly according to an embodiment of the present disclosure.
Figure 5:
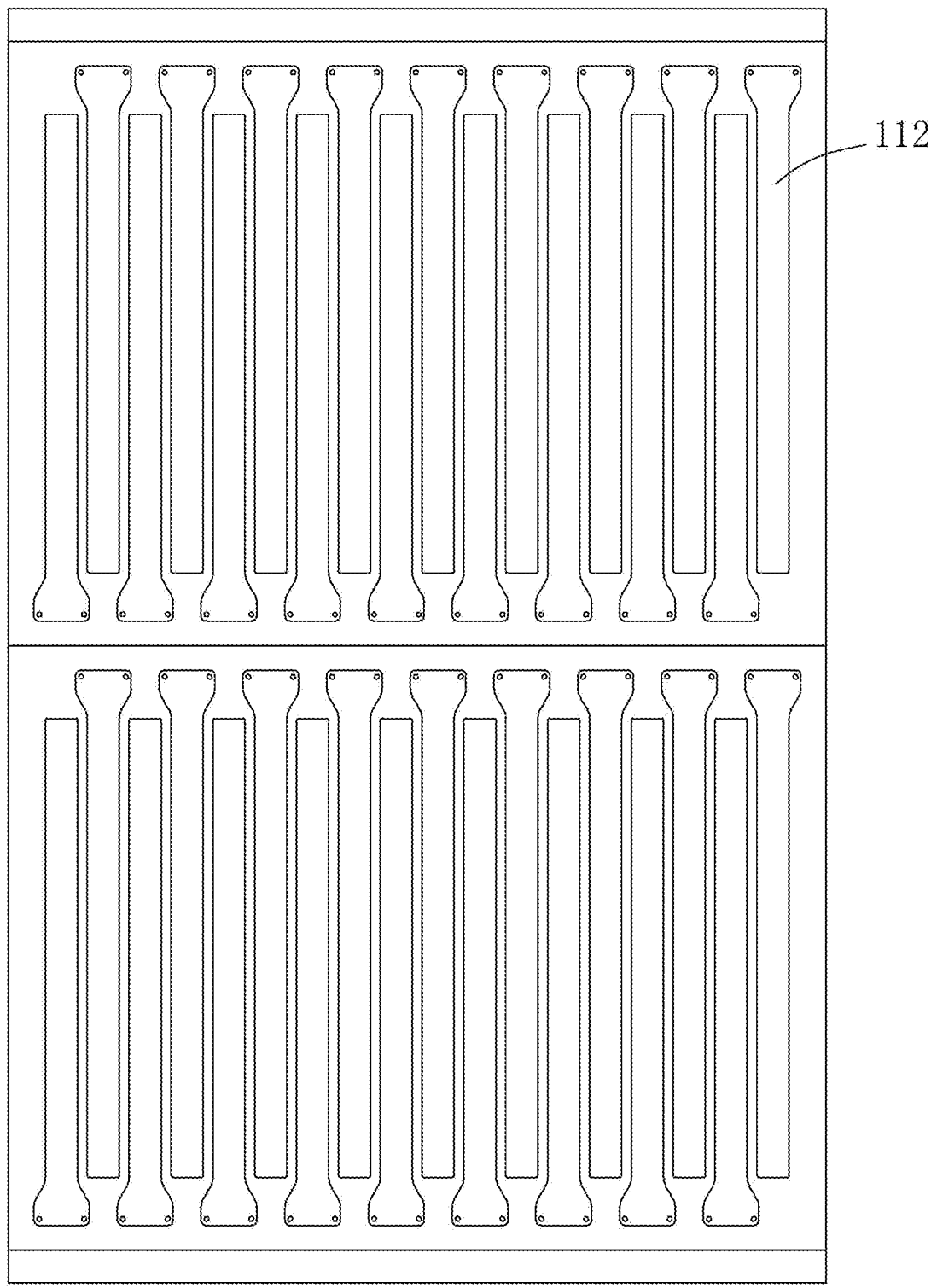
FIG. 5 is a schematic diagram of a layout structure of a second FPC in a microphone assembly according to an embodiment of the present disclosure.

Besides, it should be noted that in the prior art, a large circuit board may occupy a large space, especially those with a large size and an irregular shape, as shown in FIG. 3. In other words, a layout of a certain size can accommodate a small number of circuit boards, which makes the circuit boards more difficult to be arranged, is easy to cause a waste of layout resources, and is not conducive to achieve the target yield of production line delivery. In this embodiment, the circuit board 11 is divided into at least two parts, including a first FPC 111 and a second FPC 112. Therefore, the first FPC 111 and the second FPC 112 can be arranged respectively, which is not affected by a matching structure of the first FPC 111 and the second FPC 112 (that is, not affected by the size and shape of the entire circuit board 11), as shown in FIG. 4 and FIG. 5, thus making full use of the layout space and increasing the arrangement of the first FPC 111 and the second FPC 112 (i.e., reducing arrangement complex of the entire circuit board 11).

Those of ordinary skill in the art can appreciate that the above embodiments are specific embodiments for implementing the present disclosure. In actual applications, various changes can be made in the form and details without departing from the spirit and scope of the present disclosure.

What is claimed is:

1. A microphone assembly, comprising:
a circuit board comprising a first flexible printed circuit board (FPC) extending along a first direction, and a second FPC extending along a second direction different from the first direction and separated from the first FPC, the second FPC and the first FPC being fixed to each other to form an electrical connection; and
a microphone array disposed on the circuit board, the microphone array being disposed on the first FPC;
the second FPC has a shorter length than the first FPC;
the second FPC comprises a rectangular body portion, and a connection portion connected to the body portion, the connection portion having a greater width than the body portion, and the second FPC being connected to the first FPC via the connection portion to form the electrical connection;
the connection portion comprises a first region connected to the body portion and gradually widening along a direction facing away from the body portion, and a second region connected to a widest part of the first region with a width equal to the widest part.

2. The microphone assembly as described in claim 1, wherein the second FPC and the first PFC are strip-like structures, and one end of the second FPC is connected near an end of the first FPC.

3. The microphone assembly as described in claim 2, wherein the microphone array comprises four microphones distributed on the first FPC having a strip-like shape along the first direction and pairwise spaced part from each other.

4. The microphone assembly as described in claim 1, wherein the second FPC is connected to the first FPC via a connector.

5. The microphone assembly as described in claim 1, wherein the second FPC is connected to the first FPC via a bonding pad.

* * * * *